(12) United States Patent
Min

(10) Patent No.: US 10,480,760 B2
(45) Date of Patent: Nov. 19, 2019

(54) LIGHT SOURCE MODULE

(71) Applicant: LG INNOTEK CO., LTD., Seoul (KR)

(72) Inventor: Byeong Guk Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 86 days.

(21) Appl. No.: 15/737,709

(22) PCT Filed: Jun. 22, 2016

(86) PCT No.: PCT/KR2016/006611
§ 371 (c)(1),
(2) Date: Dec. 18, 2017

(87) PCT Pub. No.: WO2016/208958
PCT Pub. Date: Dec. 29, 2016

(65) Prior Publication Data
US 2019/0003689 A1 Jan. 3, 2019

(30) Foreign Application Priority Data
Jun. 24, 2015 (KR) .................. 10-2015-0089447

(51) Int. Cl.
F21V 21/00 (2006.01)
F21V 19/00 (2006.01)
(Continued)

(52) U.S. Cl.
CPC ............ *F21V 19/0015* (2013.01); *F21S 4/28* (2016.01); *H05K 1/142* (2013.01); *H05K 1/181* (2013.01);
(Continued)

(58) Field of Classification Search
CPC ........... F21S 4/28; H05K 1/142; H05K 1/181; H05K 2201/10106; F21Y 2105/16; F21Y 2113/10
(Continued)

(56) References Cited

U.S. PATENT DOCUMENTS 8,872,198 B2* 10/2014 Shibusawa .......... H01L 25/0753
257/88
2011/0205727 A1 8/2011 Kim et al.
(Continued)

FOREIGN PATENT DOCUMENTS

JP 2011-222506 11/2011
JP 2012-104731 5/2012
(Continued)

OTHER PUBLICATIONS

International Search Report (with English Translation) and Written Opinion dated Sep. 28, 2016 issued in Application No. PCT/KR2016/006611.

*Primary Examiner* — Laura K Tso
(74) *Attorney, Agent, or Firm* — Ked & Associates, LLP

(57) ABSTRACT

An embodiment provides a lighting source module. The lighting source module includes: a plurality of first light emitting devices having a first light emitting chip and first phosphor and emitting white light having a first color temperature; a plurality of second light emitting devices having a second light emitting chip and second phosphor, and emitting white light having a second color temperature; and a plurality of circuit boards having the first and second light emitting devices thereon, in which columns of the first light emitting devices and columns of the second light emitting devices are alternately disposed on the circuit boards, and column of light emitting devices emitting white light having the same color temperature are disposed at both ends of the circuit boards.

19 Claims, 3 Drawing Sheets

(51) Int. Cl.
  *H05K 1/14* (2006.01)
  *H05K 1/18* (2006.01)
  *F21S 4/28* (2016.01)
  *F21Y 105/16* (2016.01)
  *F21Y 115/10* (2016.01)
  *F21Y 105/12* (2016.01)
  *F21Y 113/10* (2016.01)

(52) U.S. Cl.
  CPC ....... *F21Y 2105/12* (2016.08); *F21Y 2105/16* (2016.08); *F21Y 2113/10* (2016.08); *F21Y 2115/10* (2016.08); *H05K 2201/10106* (2013.01)

(58) Field of Classification Search
  USPC .......................................... 362/231, 249.02
  See application file for complete search history.

(56) References Cited

U.S. PATENT DOCUMENTS

| | | |
|---|---|---|
| 2015/0023057 A1 | 1/2015 | Kim et al. |
| 2015/0260351 A1* | 9/2015 | Hiramatsu .............. F21S 8/026 362/231 |

FOREIGN PATENT DOCUMENTS

| | | |
|---|---|---|
| KR | 10-2009-0075471 | 7/2009 |
| KR | 10-2010-0012113 | 2/2010 |
| KR | 10-2011-0053572 | 5/2011 |
| KR | 10-2012-0077919 | 7/2012 |
| KR | 10-2014-0079999 | 6/2014 |
| KR | 10-2015-0011206 | 1/2015 |

* cited by examiner

LIGHT SOURCE MODULE

CROSS-REFERENCE TO RELATED PATENT APPLICATIONS

This application is a U.S. National Stage Application under 35 U.S.C. § 371 of PCT Application No. PCT/KR2016/006611, filed Jun. 22, 2016, which claims priority to Korean Patent Application No. 10-2015-0089447, filed Jun. 24, 2015, whose entire disclosures are hereby incorporated by reference.

TECHNICAL FIELD

An embodiment relates to a lighting source module.

An embodiment provides a lighting source module that includes an array of light emitting devices that emit light having different color temperatures.

An embodiment provides a lighting source module that includes light emitting devices having the same color temperature and disposed at the outermost sides of at least two circuit boards having light emitting devices that emit light having different color temperatures An embodiment provides a lighting source module that includes light emitting devices disposed on both sides of difference circuit boards and emitting light having the same color temperature.

BACKGROUND ART

Electronic devices such as various mobile phones and TVs have been developed. These electronic devices are equipped with a printed circuit board (PCB) with various parts, which are components enabling operation of the electronic devices, mounted therein.

A light emitting diode (hereafter, referred to as an LED), which is a diode that emits light when a current is supplied, is a light emitting device in which electrons are excited to a higher energy level when a small number of carriers are injected into an active layer and the energy of the electrons is emitted as electromagnetic waves having the wavelength of light when the electrons return to the stable state.

Recently, LEDs can be manufactured with high luminance and quality over a common product with low brightness by virtue of rapid development of semiconductor technology. Further, as high-performance blue and white diodes can be implemented, the availability of LEDs is being expanded to advance lighting sources, various displays etc. A device formed in a predetermined size by a single LED or by coupling a plurality of LEDs is called an LED module, which is used for various displays and imaging devices.

DISCLOSURE

Technical Problem

An embodiment provides a lighting source module that includes an array of light emitting devices, which emit light having different color temperatures, on a plurality of circuit boards.

An embodiment provides a lighting source module that includes an array of light emitting devices, which emit light having the same color temperature, at both ends of a plurality of circuit boards.

An embodiment provides a lighting source module that includes a column of light emitting devices, which emit light having the same color temperature, at both ends of a plurality of circuit boards.

An embodiment provides a lighting source module in which columns of light emitting devices having different color temperatures are alternately arranged on a plurality of circuit boards and the outermost column is composed of light emitting devices having the same color temperature.

Technical Solution

A lighting source module according to an embodiment includes: a plurality of first light emitting devices having a first light emitting chip and first phosphor and emitting white light having a first color temperature; a plurality of second light emitting devices having a second light emitting chip and second phosphor, and emitting white light having a second color temperature; and a plurality of circuit boards having the first and second light emitting devices thereon, in which columns of the first light emitting devices and columns of the second light emitting devices are alternately disposed on the circuit boards, and column of light emitting devices emitting white light having the same color temperature are disposed at both ends of the circuit boards.

A lighting source module according to another embodiment includes: a plurality of circuit boards; a plurality of light emitting devices disposed on the circuit boards; and a plurality of connector substrates connecting the circuit boards, in which the light emitting devices emit light having different color temperatures and columns of light emitting devices emitting light having the same color temperature are disposed at both ends of the circuit boards.

Advantageous Effects

According to an embodiment, it is possible to remove a color temperature difference between the outermost areas in a lighting source module.

According to an embodiment, it is possible to improve uniformity of color throughout the area of a lighting source module.

According to an embodiment, it is possible to improve reliability of a lighting source module and a lighting device equipped with the lighting source module.

MODES OF THE INVENTION

In the following description, when a substrate, a frame, a sheet, a layer, or a pattern is described being 'on' or 'under' another substrate, frame, sheet, layer, or pattern, the terms 'on' and 'under' include meanings of 'directly' or 'indirectly' with another component therebetween'. Further, the term 'on' or 'under' a component is defined on the basis of the drawings.

Figure 1:
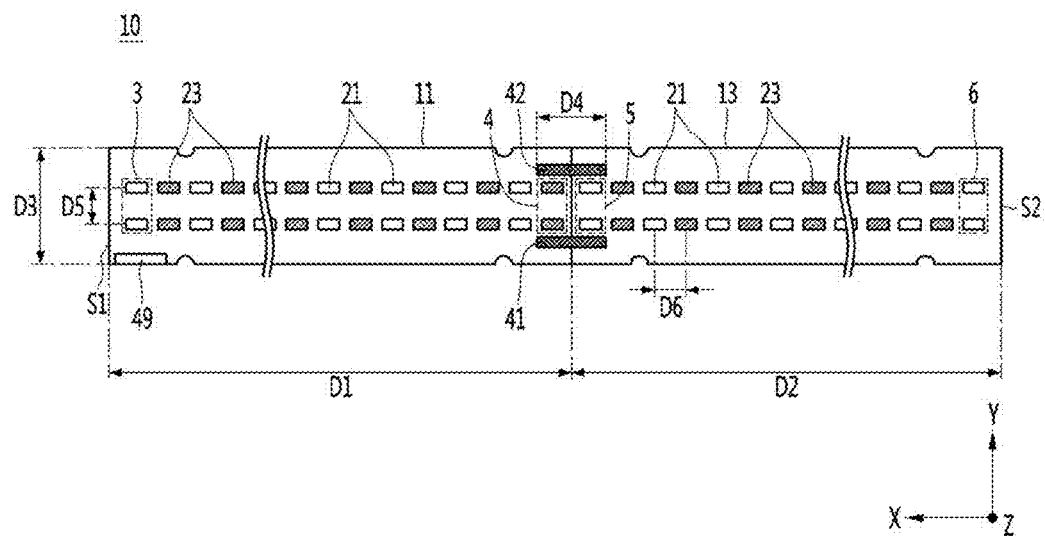
FIG. 1 is a plan view of a lighting source module according to an embodiment.
Figure 2:
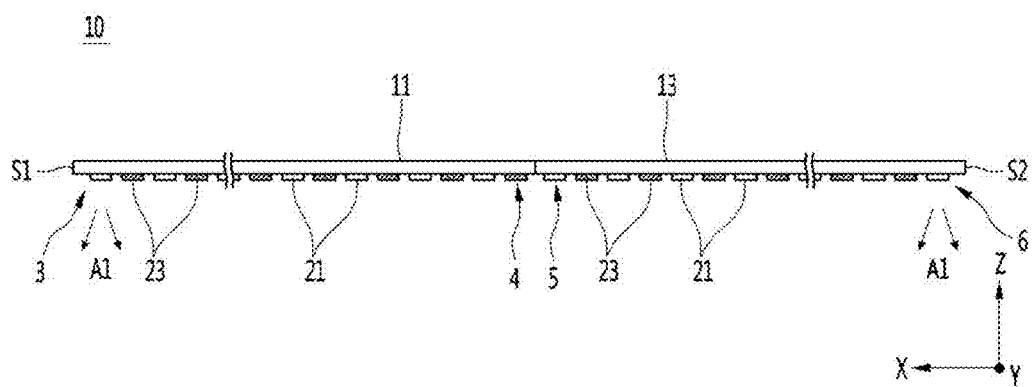
FIG. 2 is a side cross-sectional view of the lighting source module of FIG. 1.

FIG. 1 is a plan view of a lighting source module according to an embodiment and FIG. 2 is a side cross-sectional view of the light sourcing module of FIG. 1.

Referring to FIGS. 1 and 2, a lighting source module 10 includes light emitting devices 21 and 23 that emit white light having different color temperatures on a plurality of circuit boards 11 and 13. The light emitting devices 21 and 23 can emit light having at least two, three or more color temperatures. The light emitting devices 21 and 23 may have columns with at least two or more color temperatures. The columns are perpendicular to rows and may have two or more light emitting devices that emit light having the same color temperature.

The lighting source module 10 includes a plurality of circuit boards 11 and 13, first light emitting devices 21 that emit white light having a first color temperature on the circuit boards 11 and 13, and second light emitting devices 23 that emit white light having a second color temperature on the circuit boards 11 and 13.

At least two, three or more circuit boards 11 and 13 may be disposed in a first direction (X). The circuit boards 11 and 13 include first and second circuit boards 11 and 13 and supply power to the first and second light emitting devices 21 and 23. The circuit boards 11 and 13 may include a resin PCB, a metal core PCB (MCPCB), and a flexible PCB (FPCB), but they are not limited thereto.

The first and second circuit boards 11 and 13 may have a polygonal shape, for example, a rectangular shape. The first and second circuit boards 11 and 13 may have the same shape. The first and second circuit boards 11 and 13 may be arranged in a longitudinal direction, for example, in the first direction (X). The first and second circuit boards 11 and 13 may be electrically connected to each other.

The first and second circuit boards 11 and 13 include at least one or a plurality of connector substrates 41 and 42. The connector substrates 41 and 42 connect the circuit boards 11 and 12 to each other. At least one or a plurality of connector substrates 41 and 42 may be disposed in the joint area between the circuit boards 11 and 13. The connector substrates 41 and 42 overlap the first and second circuit boards 11 and 13, electrically connect the first and second circuit boards 11 and 13 to each other, and support the first and second circuit boards 11 and 13. The gap between the connector substrates 41 and 42 may be larger than the gap D5 between the rows of the light emitting devices. The connector substrates 41 and 42 are disposed close to the edges of the circuit boards 11 and 13, whereby they can support the joint area between the circuit boards 11 and 13. The length D4 of the connector substrates 41 and 42 may be larger than, for example, two to four times larger than the gaps D6 between the light emitting devices 21 and 23.

The lighting source module 10 may include a connector 49. The connector 49 may be disposed on the top or the bottom of at least one of the circuit boards 11 and 13 and may be connected to an external connection terminal. A test terminal for testing the operation of a circuit pattern may be disposed on each of the circuit boards 11 and 13, but the present invention is not limited thereto.

The first and second circuit boards 11 and 13 have lengths D1 and D2 in a horizontal direction X larger than a length D3 in a vertical direction Y, respectively, and this length difference may depend on the number of the arrays of the light emitting devices 21 and 23. The horizontal length D1 of the first circuit board 11 may be the same as or different from the horizontal length D2 of the second circuit board 13. The horizontal length D1 of the first circuit board 11 may be larger than the horizontal length D2 of the second circuit board 13, in which the number of the light emitting devices 21 and 23 disposed on the first circuit board 11 may be larger than the number of the light emitting devices 21 and 23 disposed on the second circuit board 13. The number of columns of the light emitting devices disposed on the first circuit board 11 may be different from the number of columns of the light emitting devices 21 and 23 disposed on the second circuit board 13. The number of columns of the light emitting devices 21 and 23 disposed on the first circuit board 11 may be larger by one or more than the number of columns of the light emitting devices 21 and 23 disposed on the second circuit board 13.

The first light emitting devices 21 and the second light emitting devices 23 are alternately arranged on the first circuit board 11. For example, the columns of the first light emitting devices 21 and the columns of the second light emitting devices 23 are alternately arranged in the horizontal direction (X) on the first circuit board 11. Columns each composed of the same number of light emitting devices (for example, 21), for example, composed of at least two lighting devices are disposed in the vertical direction on the first circuit board 11. That is, at least two light emitting devices having the same color temperature may be included in one column.

The second circuit board 13 is disposed in close contact with the first circuit board 11 in the horizontal direction (X), and the columns of the first light emitting devices 21 and the columns of the second light emitting devices 23 are alternately disposed. The columns of the same light emitting devices, for example, the first light emitting devices 21 or the second light emitting devices 23 may be disposed in the vertical direction on the second circuit board 13.

According to an embodiment, columns of light emitting devices that emit light having at least two kinds of color temperatures may be alternately disposed on the circuit boards 11 and 13. That is, columns having at least two kinds of color temperatures may be alternately disposed.

A column 3 of first light emitting devices 21 is disposed close to a first side S1 of the lighting source module 10 on the first circuit board 11 and columns of the first and second light emitting devices 21 and 23 are alternately disposed from the column 3. A column 4 of second light emitting devices 23 may be disposed close to the second circuit board 13 on the first circuit board 11. A column 5 of second light emitting devices 23 is disposed close to the first circuit board 11 on the second circuit board 13 and columns of the first and second light emitting devices 21 and 23 are alternately disposed from the column 5. A column 6 of first light emitting devices 21 may be disposed as the last one close to a second side S2 of the lighting source module 10 on the second circuit board 23. That is, the columns 3 and 6 of light emitting devices close to the opposite sides S1 and S2 of the lighting source module 10 may be columns composed of the same light emitting devices. For example, the columns 3 and 6 of light emitting devices close to the opposite sides S1 and S2 of the lighting source module 10 may be composed of first light emitting devices 21. Accordingly, it is possible to remove a difference in color temperatures of light emitted to both edge areas of the lighting source module 10.

The number of the first light emitting devices 21 may be larger than the number of the second light emitting devices 23 on the circuit boards 11 and 13. The number of the column of the first light emitting devices 21 may be larger than the number of the column of the second light emitting devices 23 on the circuit boards 11 and 13.

The first light emitting devices 21 may be connected in series, in parallel, or in series-parallel within the circuit boards 11 and 13. The second light emitting devices 23 may be connected in series, in parallel, or in series-parallel on the circuit boards 11 and 13. The first and second light emitting devices 21 and 23 selectively emit light by a current supplied from a current controller.

The first and second light emitting devices 21 and 23 may emit the same color light, for example, white light. The first and second light emitting devices 21 and 23 each may include at least one LED chip that selectively emits light within a band from visible light to ultraviolet light.

The light emitted from first and second light emitting devices 21 and 23 may have different color temperatures. The first light emitting devices 21 emit white light having a first color temperature and the second light emitting devices 23 emit white light having a second color temperature. The first color temperature may be higher than the second color temperature. The difference between the first and second color temperatures may be 1,000K or more, for example, 1000K to 2000K.

The first color temperature has a correlated color temperature (CCT) at 5000K, for example, within a range of 6000K to 8000K. The second color temperature has a correlated color temperature 4000K or less, for example, within a range of 2000K to 4000K. According to an embodiment, the first light emitting devices 21 may be cool white LEDs and the second light emitting devices 23 may be warm white LEDs. Alternatively, the first light emitting devices 21 may be warm white LEDs and the second light emitting devices 23 may be cool white LEDs.

The lighting source module 10 emits mixed white light emitted from the first and second light emitting devices 21 and 23. Accordingly, a white lighting source module that can easily control mood light can be provided.

According to an embodiment, by giving the same color temperature to the columns 3 and 6 of light emitting devices disposed at both ends of the circuit boards 11 and 13, the color temperatures of light Al emitted from both end areas of the circuit boards 11 and 13 can be the same. Accordingly, uniformity of light can be improved to both ends of the white lighting source module. Further, by removing a color temperature difference of the light emitted from both end areas of the white lighting source module, it is possible to provide a user with light having a uniform color temperature.

The white lighting source module can provide mood light by outputting white light having various color temperatures with a uniform color temperature to the edge areas of the lighting source module, depending on the user's taste or the use state. That is, assuming the 4000K, 6000K, and 3000K are suitable for morning, afternoon, and evening, respectively, there is a need to automatically or manually adjust the color temperature of a white LED device for lighting. If the function of adjusting a color temperature can be effectively implemented, it is possible to implement mood light that can show specific moods other than the basic lighting function of lighting an indoor. Further, the mood light implemented by adjusting a color temperature can stabilize the mental state of a person in combination of luminance adjustment.

Alternatively, the outermost columns 3 and 6 on the circuit boards 11 and 13 may be columns composed of third light emitting devices having a color temperature between the first and second color temperatures, for example, 3700K to 5000K.

Figure 3:
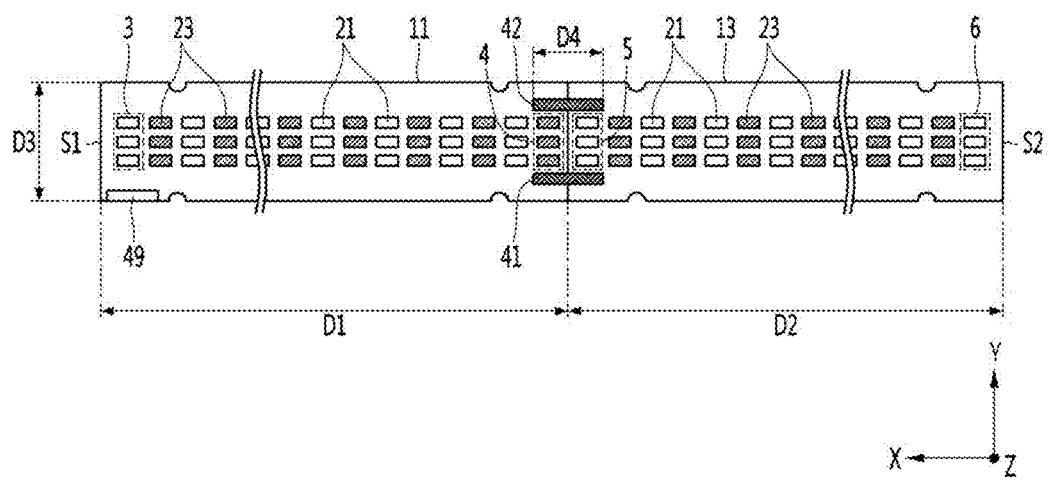
FIG. 3 is a plan view showing a lighting source module according to another embodiment.

FIG. 3 is a view showing a lighting source module according to a second embodiment. The same components as those of the first embodiment refer to the description of the first embodiment.

Referring to FIG. 3, a lighting source module includes a plurality of circuit boards 11 and 13, first light emitting devices 21 that emit white light having a first color temperature on the circuit boards 11 and 13, and second light emitting devices 23 that emit white light having a second color temperature on the circuit boards 11 and 13.

Columns of the first and second light emitting devices 21 and 23 are alternately arranged on the circuit boards 11 and 13, and at least three, four or more columns of the first and second light emitting devices 21 and 23 may be disposed. That is, three, four or more light emitting devices having the same color temperature may be disposed in each of the columns.

The circuit boards 11 and 13 include first and second circuit boards 11 and 13, the same number of second light emitting devices 23 may be disposed on each of the first and second circuit boards 11 and 13, and the number of the first light emitting devices 21 or the number of the columns of the first light emitting devices 21 disposed on the second circuit board 13 may be larger than those on the first circuit board 21.

Columns 3 and 6 composed of first light emitting devices 21 are disposed at the outermost sides on the circuit boards 11 and 13, whereby light Al emitted to both ends of the lighting source module has the same color temperature. The first light emitting devices 21 may be cool white LEDs and the second light emitting devices 23 may be warm white LEDs. Alternatively, the first light emitting devices 21 may be warm white LEDs and the second light emitting devices 23 may be cool white LEDs.

Figure 4:
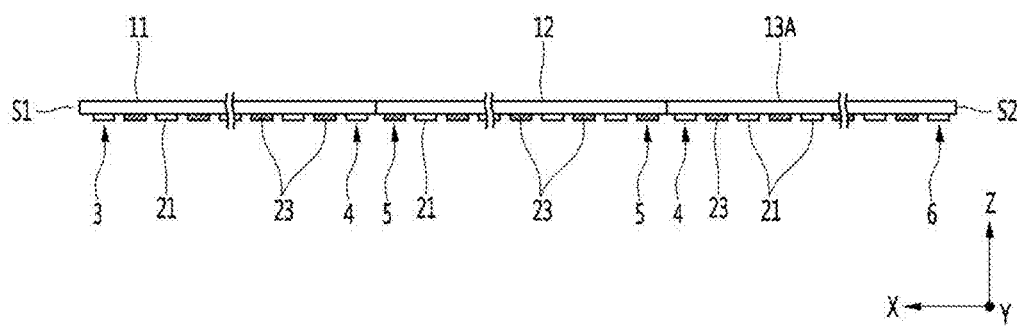
FIG. 4 is a side cross-sectional view showing a lighting source module according to another embodiment.

FIG. 4 is a side cross-sectional view showing a lighting source module according to another embodiment.

Referring to FIG. 4, a lighting source module includes a plurality of circuit boards 11, 12, and 13A, first light emitting devices 21 that emit white light having a first color temperature on the circuit boards 11, 12, and 13A, and second light emitting devices 23 that emit white light having a second color temperature on the circuit boards 11, 12, and 13A.

The circuit boards 11, 12, and 13A include first to third circuit boards 11, 12, and 13A, and the first and second light emitting devices 21 and 23 are alternately disposed on the first to third circuit boards 11, 12, and 13A. The first and second light emitting devices 21 and 23 disposed on the first to third circuit boards 11, 12, and 13A may be selectively connected.

Columns of the first and second light emitting devices 21 and 23 are alternately arranged on the circuit boards 11, 12, and 13A, and at least three, four or more columns of the first and second light emitting devices 21 and 23 may be disposed.

The same number of the second light emitting devices 23 or the same number of the column of the second light emitting devices 23 may be disposed on the first to third circuit boards 11, 12, and 13A, the number of the first light emitting devices 21 or the number of the columns of the first light emitting devices 21 disposed on the third circuit board 13A may be larger than those on the first and second circuit boards 11 and 12.

Columns 3 and 6 composed of first light emitting devices 21 are disposed at the outermost sides on the circuit boards 11, 12, and 13A, whereby light Al emitted from both ends of the lighting source module has the same color temperature. The first light emitting devices 21 may be cool white LEDs and the second light emitting devices 23 may be warm white LEDs. Alternatively, the first light emitting devices 21 may be warm white LEDs and the second light emitting devices 23 may be cool white LEDs. That is, the columns 3 and 6 at both ends of the lighting source module can emit the same cool white light or warm white light, so the color difference between both ends can be removed.

Figure 5:
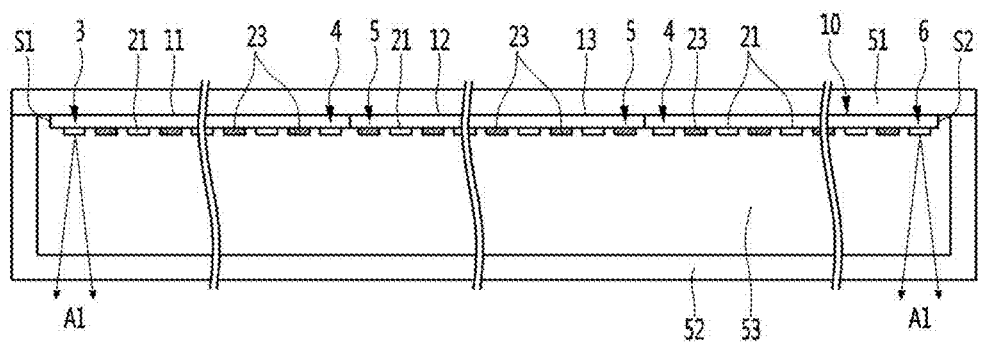
FIG. 5 is a view showing a lighting device having a lighting source module according to an embodiment.

FIG. 5 is a view showing a lighting device having a lighting source module according to an embodiment.

Referring to FIG. 5, a lighting device includes a back cover 51 to which the lighting source module 10 is fixed and a front cover 52 disposed under the back cover 51 and transmits light.

The back cover 51 is fixed to a lighting structure, for example, a ceiling, and can supply power to the circuit boards 11 and 13 of the lighting source module 10 and provide a heat dissipation member.

The front cover 52 includes a transparent plastic or glass material and diffuses the light from the lighting source module 10. The front cover 52 may be a transparent cover or a transparent sheet. The sheet may include a diffusing sheet.

The area 53 between the front cover 51 and the lighting source module 10 may be an air area or may be filled with another transparent member, but is not limited thereto.

The light Al emitted from both ends of the lighting source module 10 travels through the front cover 51, in which there is no color temperature difference between the light Al traveling to both ends of the front cover 52. That is, a color temperature difference can be reduced by the outermost columns 3 and 6 of the first light emitting devices 21.

Figure 6:
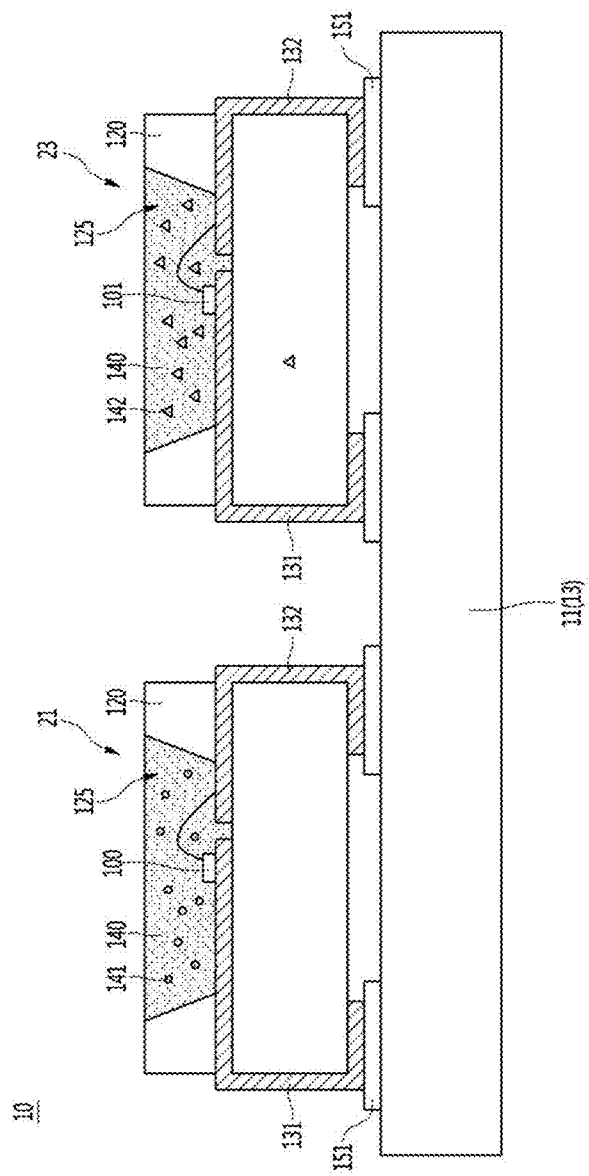
FIG. 6 is a view showing first and second light emitting devices of a lighting source module according to an embodiment.

FIG. 6 is a view showing light emitting devices according to an embodiment.

Referring to FIG. 6, in a lighting source module according to an embodiment, the first and second light emitting devices 21 and 23 are bonded to the circuit boards 11 and 13 through adhesive member 151.

The first light emitting devices 21 each may include a body 120, a first lead electrode 131 and a second lead electrode 132 disposed on the body 120, a first light emitting chip 100 disposed on the body 120 and electrically connected to the first lead electrode 131 and the second lead electrode 132, and a molding member 140 having first phosphor 141 covering the first light emitting chip 100.

The second light emitting devices 23 each may include a body 120, a first lead electrode 131 and a second lead electrode 132 disposed on the body 120, a second light emitting chip 101 disposed on the body 120 and electrically connected to the first lead electrode 131 and the second lead electrode 132, and a molding member 140 having second phosphors 142 covering the second light emitting chip 101.

The bodies 120 may be made of silicon, synthetic resin, or metal and may have a cavity 125 having a slope around the first and second light emitting chips 100 and 101.

The first lead electrode 131 and the second lead electrode 132 are electrically separated from each other and supply power to the first and second light emitting chips 100 and 101. Further, the first lead electrode 131 and the second lead electrode 132 can increase light efficiency by reflecting light generated from the first and second light emitting chips 100 and 101 and can also dissipate heat generated by the first and second light emitting chips 100 and 101 to the outside.

The first and second light emitting chips 100 and 101 may be disposed on the body 120 or on at least one of the first lead electrode 131 and the second lead electrode 132.

The first and second light emitting chips 100 and 101 may be electrically connected to the first lead electrode 131 and the second lead electrode 132 by any one of a wire type, a flip chip type, and a die-bonding type.

The first and second light emitting chips 100 and 101 may emit light having the same peak wavelength, for example, a blue peak wavelength. Alternatively, the first and second light emitting chips 100 and 101 may emit light having different peak wavelengths. For example, the first light emitting chip 100 may emit light having a blue peak wavelength and the second light emitting chip 101 may emit light having an ultraviolet peak wavelength.

The molding member 140 of the first and second light emitting devices 21 and 23 can protect the first and second light emitting chips 100 and 101 by surrounding the first light emitting chip 100 and the second light emitting chip 101.

The first phosphor 141 may be included in the molding member 140 of the first light emitting device 21, and the second phosphor 142 may be included in the molding member 140 of the second light emitting device 23. The first and second phosphors 141 and 142 can change the wavelength of the light emitted from the first and second light emitting chips 100 and 101. The first phosphor 141 may be yellow phosphor or include green phosphor and orange phosphor, and the second phosphor 142 may include at least two or more of blue, green, yellow, and red phosphor. For example, when the second light emitting chip 101 is a blue LED chip, the second phosphor may include yellow phosphor and red phosphor, and when the second light emitting chip 101 is an ultraviolet LED chip, the second phosphor may include blue, green, and red phosphor. The first phosphor 141 and the second phosphor 142 may be the same kind or different kinds of phosphors.

The larger the amount of the yellow phosphor to be added, the lower the first color temperature of the white light emitted from the first light emitting device 21 may be. For example, white having a relatively low color temperature corresponds to relatively warm white, and white having a relatively high color temperature corresponds to relatively cool white. That is, the color temperatures of the first and second light emitting devices 21 and 23 may depend on the kind and the amount of the phosphor.

When it is possible to increase the current that is supplied to the first light emitting device 21, it is possible to lower the color temperature of the finally emitted white light, while it is possible to increase the color temperature of the entire last white light by reducing the current flowing through the second light emitting device 23.

According to another embodiment, the lighting source module described in the previous embodiments may include a lamp, a street lamp, an electronic display board, a headlamp etc. Further, the lighting device according to an embodiment may be applied to not only the headlamps, but the taillights of a vehicle.

As another example, a lens, a light guide plate, a prism sheet, a diffusing sheet etc. which are optical member may be disposed in the light path of the light emitting devices according to the previous embodiments. The light emitting devices and circuit boards may function as a light unit. The light unit may be implemented in a top view or a side view type to be provided displays of a mobile terminal, a notebook etc., or to be applied to a lighting device and an indicator in various ways.

The present invention is limited not to the embodiments described above and the accompanying drawings, but to the claims. Accordingly, it would be apparent to those skilled in the art that the present invention may be replaced, changed, and modified in various ways without departing from the scope of the present invention, and those replacement, change, and modification should be construed as being included in the accompanying drawings.

INDUSTRIAL APPLICABILITY

A lighting source module according to an embodiment can be applied to a device for emitting white light.

A lighting source module according to an embodiment can be applied to a lighting device.

A lighting source module according to an embodiment can be applied to a device that can control light.

A lighting source module according to an embodiment can be applied to a flat lighting device.

The invention claimed is:

1. A lighting source module comprising:
a plurality of first light emitting devices having a first light emitting chip and first phosphor and emitting white light having a first color temperature;
a plurality of second light emitting devices having a second light emitting chip and second phosphor, and emitting white light having a second color temperature; and
a plurality of circuit boards having the first and second light emitting devices thereon,
wherein columns of the first light emitting devices and columns of the second light emitting devices are alternately disposed on the circuit boards,
wherein column of light emitting devices emitting white light having the same color temperature are disposed at both ends of the circuit boards,
wherein the plurality of circuit boards is disposed in a first direction,
wherein each of the plurality of circuit boards has a different length from each other in the first direction,
wherein the plurality of first light emitting devices disposed on the plurality of circuit boards are electrically connected to each other, and
wherein the plurality of second light emitting devices disposed on the plurality of circuit boards are electrically connected to each other.

2. The lighting source module of claim 1, wherein the first and second light emitting devices are disposed at least in two rows, and first columns of the first light emitting devices are disposed at both ends of the circuit boards.

3. The lighting source module of claim 1, wherein the first and second light emitting devices are disposed at least in two rows, and second columns of the second light emitting devices are disposed at both ends of the circuit boards.

4. The lighting source module of claim 1, wherein a first column of the first light emitting devices and a second column of the second light emitting devices are disposed in an area close to a joint between the circuit boards.

5. The lighting source module of claim 1, wherein the first light emitting devices disposed on the circuit boards are connected in series, in parallel, or in series-parallel, and the second light emitting devices disposed on the circuit boards are connected in series, in parallel, or in series-parallel.

6. The lighting source module of claim 1, wherein a difference between the first color temperature and the second color temperature is 1000K or more.

7. The lighting source module of claim 1, wherein the first light emitting devices are cool white LEDs, and the second light emitting devices are warm white LEDs.

8. The lighting source module of claim 1, wherein numbers of the first and second light emitting devices disposed on any one of the circuit boards are different.

9. The lighting source module of claim 1, wherein a plurality of connector substrates electrically connecting different circuit boards is disposed on the circuit boards.

10. A lighting source module comprising:
a plurality of circuit boards;
a plurality of light emitting devices disposed on the plurality of circuit boards; and
a plurality of connector substrates connecting the plurality of circuit boards,
wherein the light emitting devices emit light having different color temperatures and columns of light emitting devices emitting light having the same color temperature are disposed at both ends of the circuit boards,
wherein the light emitting devices include a plurality of first light emitting devices emitting white light having a first color temperature and a plurality of second light emitting devices emitting white light having a second color temperature,
wherein the plurality of circuit boards is disposed in a first direction,
wherein each of the plurality of circuit boards has a different length from each other in the first direction,
wherein the plurality of first light emitting devices disposed on the plurality of circuit boards are electrically connected to each other,
wherein the plurality of second light emitting devices disposed on the plurality of circuit boards are electrically connected to each other, and
wherein a number of the first light emitting devices and the second light emitting devices disposed on any one of the plurality of circuit boards is different.

11. The lighting source module of claim 10, wherein the first color temperature is higher than the second color temperature, and columns of the first light emitting devices are disposed at both ends of the circuit boards.

12. The lighting source module of claim 11, wherein columns of the first light emitting devices and columns of the second light emitting devices are alternately disposed on the circuit boards.

13. The lighting source module of claim 10, wherein two or more light emitting devices are disposed in the columns.

14. The lighting source module of claim 13, wherein the light emitting devices are disposed at least in two rows, and a gap between the connector substrates is larger than a gap between the light emitting devices.

15. The lighting source module of claim 13, wherein columns of light emitting devices emitting light having different color temperatures are disposed in a joint area between the circuit boards.

16. The lighting source module of claim 10, wherein a difference between the first color temperature and the second color temperature is 1000K or more, and a number of columns of the first light emitting devices is larger than a number of columns of the second light emitting devices.

17. The lighting source module of claim 16, wherein the first light emitting devices are cool white LEDs and the second light emitting devices are warm white LEDs.

18. The lighting source module of claim 10, wherein the light emitting devices emit light having at least three color temperatures.

19. The lighting source module of claim 10, wherein a transparent cover is disposed on light emission sides of the light emitting devices.

* * * * *